United States Patent

Polignano et al.

(10) Patent No.: US 6,437,592 B1
(45) Date of Patent: Aug. 20, 2002

(54) CHARACTERIZATION OF A SEMICONDUCTOR/DIELECTRIC INTERFACE BY PHOTOCURRENT MEASUREMENTS

(75) Inventors: Maria Luisa Polignano, Cambiago; Anna Paola Caricato, Lecce; Daniele Caputo, Milan, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/491,945

(22) Filed: Jan. 26, 2000

(30) Foreign Application Priority Data

Jan. 26, 1999 (EP) .............................. 99830030

(51) Int. Cl.$^7$ .............................................. G01R 31/26
(52) U.S. Cl. ...................... 324/765; 324/767; 324/158.1
(58) Field of Search ................................ 324/752, 765, 324/767, 158.1

(56) References Cited

U.S. PATENT DOCUMENTS

| | | | |
|---|---|---|---|
| 4,103,228 A | * 7/1978 | Ham | 324/765 |
| 4,420,497 A | 12/1983 | Tickle | 427/8 |
| 4,433,288 A | 2/1984 | Moore | 324/158 D |
| 4,473,795 A | * 9/1984 | Wood | 324/501 |
| 5,130,643 A | 7/1992 | Foell et al. | 324/158 R |
| 5,519,334 A | * 5/1996 | Dawson | 324/752 |
| 5,770,946 A | * 6/1998 | Patterson | 324/752 |
| 5,963,040 A | * 10/1999 | Liu | 324/765 |
| 6,005,400 A | * 12/1999 | Thundat et al. | 324/752 |

OTHER PUBLICATIONS

Lehmann, et al., J. Electrochem: Solid–State Science and Technology, Minority Carrier Diffusion Length Mapping in Silicon Wafers Using a Si–Electrolyte –Contact, vol. 135, No. 11 (Nov. 1988).

* cited by examiner

Primary Examiner—Michael J. Sherry
Assistant Examiner—Jermele M. Hollington
(74) Attorney, Agent, or Firm—Lisa K. Jorgenson; Allen, Dyer, Doppelt, Milbrath & Gilchrist, P.A.

(57) ABSTRACT

An interface between a semiconductor substrate/dielectric layer is characterized through measurements of a photocurrent. The photocurrent is induced in the semiconductor substrate by scanning a certain area of the interface with a laser beam and which is collected via a Schottky contact. The Schottky contact is established by inversely biasing a first electrolyte with respect to a potential of the bulk of the semiconductor substrate. The first electrolyte is capable of etching any native or thermal oxide that may exist on the contact area with the semiconductor substrate. The surface potential of the semiconductor substrate/dielectric interface is controlled by a gate electrode established on the dielectric layer by way of a second electrolyte. The second electrolyte is not aggressive to the dielectric material and is biased by an electrode immersed therein with respect to the potential of the bulk of the semiconductor substrate.

34 Claims, 1 Drawing Sheet

CHARACTERIZATION OF A SEMICONDUCTOR/DIELECTRIC INTERFACE BY PHOTOCURRENT MEASUREMENTS

FIELD OF THE INVENTION

The present invention relates in general to characterization and mapping techniques of a semiconductor substrate using photocurrent measurements induced by a laser beam scanning the surface of the semiconductor substrate. The photocurrents are collected through contacts established with an electrolytic solution. More particularly, the present invention relates to characterization techniques of an interface between a semiconductor substrate and a thermally grown or deposited dielectric layer.

BACKGROUND OF THE INVENTION

Photocurrent measurements using an electrolyte in contact with the surface of the semiconductor substrate, and in which is immersed an electrode of a nonpassivating noble metal, are notably used to measure the mean life of bulk minority carriers of a semiconductor silicon wafer, as disclosed in Lehmann et al., J. Electrochem. Soc. 135, 2831 (1988). A nonpassivating noble metal, such as platinum, establishes electrical connection to a biasing circuit. According to this technique, excess carriers are injected using a laser beam on the wafer's front surface and are collected through an inversely biased Schottky contact. The Schottky contact is formed on the wafer's back surface (backside photocurrent mode) or on the same wafer's front surface (frontside photocurrent mode).

Often, when operating in a backside photocurrent mode by collecting the photocurrent at the wafer's back surface, an area of the wafer's front is immersed or contacted with a solution suitable to passivate the superficial layers of the wafer. Also, the Schottky contact is biased through a contact established on the wafer's back surface using an electrolyte with a nonpassivating electrode of a noble metal, such as platinum, immersed in the electrolytic solution.

The Schottky contact must be inversely biased with respect to the bulk potential of the wafer. The wafer is grounded through one or more resistive contacts formed on the silicon around the contacted areas. The one or more resistive contacts may also be formed through the electric charges collecting electrolytic solution, and eventually through the passivating solution.

In commercially available instrumentation, such as, for example, the Electrolytic Metal Tracer (Elymat) of GeMeTec GmbH, both the passivating solution and the electrolytic solution used to form the Schottky contact for collecting photocurrents includes a diluted hydrofluoric (HF) acid solution. Any native or thermal oxide film that may be present on the surface of the semiconductor wafer is etched away by the HF solution. This also ensures an optimal surface passivation of the silicon, as disclosed in Yablonovitch et al., Phys. Rev. Letters 57, 249 (1986).

Based upon the intended application, the current may be collected on either the wafer's backside or frontside through electrodes of a nonpassivating noble metal, as disclosed in Foll, Symp. on Advanced Science Technology and of Silicon Material, Kona, Hawaii, 1991. The nonpassivating noble metal typically includes platinum.

The light source for stimulating the photocurrent is a laser beam focussed on the wafer's surface, and eventually through the film of a passivating HF solution. The laser beam is scanned in successive lines to produce maps of the mean life of the bulk carriers.

Proposals have been made for modifying this measuring technique to adapt it for evaluation of the surface recombination velocity at the interface between a semiconductor substrate and a dielectric layer. The substrate is typically silicon, and the dielectric layer is a thermally grown silicon oxide, i.e., a gate oxide or a tunnel oxide, for example. This is disclosed in the following articles: Polignano et al. Journal of Solids non-Crystalline 216, 88 (1977), Ostendorf et al., Defects and Impurity Engineered Semiconductor Devices PV 378, p. 579, The Material Research Society Symposium Proceedings, Pittsburgh, Pa (1995).

According to these modifications, the laser-beam scans the surface of the dielectric layer that covers the semiconductor substrate in absence of a film of a passivating acid solution. Otherwise, if present, it would etch the dielectric oxide and would destroy the interface being examined.

In these conditions, the photocurrent collected through the Schottky contact depends on the bulk minority carrier's mean life as well as on the surface recombination velocity at the semiconductor-dielectric interface. The Schottky contact is preferably established on the backside of the wafer of semiconducting silicon through an electrolyte. Both parameters may be assessed from a sequence of measurements carried out at different conditions.

The surface recombination velocity is a parameter that may be extremely useful for characterizing semiconductor/dielectric interfaces. For example, an oxide/silicon interface of a gate oxide or tunnel oxide may be characterized.

The extension of photocurrent measuring techniques to the characterization of semiconductor/dielectric interfaces is of great interest because these measurement techniques, as compared to others, require a minimum sample preparation and are able to generate detailed maps of the entire wafer's surface. Although of great interest, this technique has serious limitations. The surface recombination is significantly influenced by the density of the superficial layers and by the surface potential.

It has been demonstrated that the surface recombination velocity may dramatically vary upon the varying of the surface potential, as disclosed in Aberle et al., J. Appl. Phys. 71, 4422 (1992). The surface potential varies from a condition of an accumulation of majority carriers with respect to the bulk density, to a condition of inversion. The interface at the silicon is a concentration of minority carriers comparable to the concentration of majority carriers in the bulk, as it may occur in presence of electric charges in the oxide at the interface.

However, according to the present techniques, the surface potential cannot be controlled and effects due to the superficial layer density and to eventual electric charges in the oxide cannot be distinguished.

SUMMARY OF THE INVENTION

The shortcomings of the above described techniques are overcome by substantially forming a gate electrode using a layer of electrolyte in contact with the dielectric layer and biased through an electrode immersed in it. This is made possible by using an electrolyte that is not aggressive to the dielectric oxide. A solution of an organic acid, such as an acetic acid solution, for example, and biased with a platinum electrode is suitable to form an effective gate electrode coupled to the silicon oxide dielectric. Through this interface it is possible to control the surface potential at the semiconductor/dielectric interface.

The possibility to control the potential at the semiconductor/dielectric interface by suitably biasing the gate electrode formed by the electrolyte, with respect to the semiconductor substrate potential, permits assessment of the surface recombination velocity at the interface as a function of the voltage applied to the gate electrode. This is in addition to a charge injection level established by controlling the scanning laser beam. The analysis of this data permits determination of both the density of surface states and the electric charges in the dielectric. An analytical approach similar to the one described above may be utilized for a quick evaluation. A more accurate analysis may be carried out by the use of a numerical processor for processing device equations. Device equations include, for example, continuity and drift-diffusion equations.

Compared to the known methods of measuring the surface recombination velocity, the method of the invention has the advantage of discriminating between the effects caused by density of surface states and by eventual electric charges in the dielectric, thus providing information comparable to that obtained through capacitance-voltage measurements. Compared to traditional characterization methods based on capacitance-voltage measurements, a method based on surface recombination measurements has the advantage of not requiring the formation of capacitors, and therefore, permits faster quality control checks of the semiconductor/dielectric interface.

Moreover, the wafers may be more accurately mapped through surface recombination measurements than through capacitance-voltage measurements, and an accurate map of the entire wafer may often reveal the reasons for an observed interface degradation.

BRIEF DESCRIPTION OF THE DRAWING

The FIGURE is a sectional view of the measurement instrumentation according to the present invention.

DETAILED DESCRIPTION OF THE PREFERRED EMBODIMENTS

Figure 1:
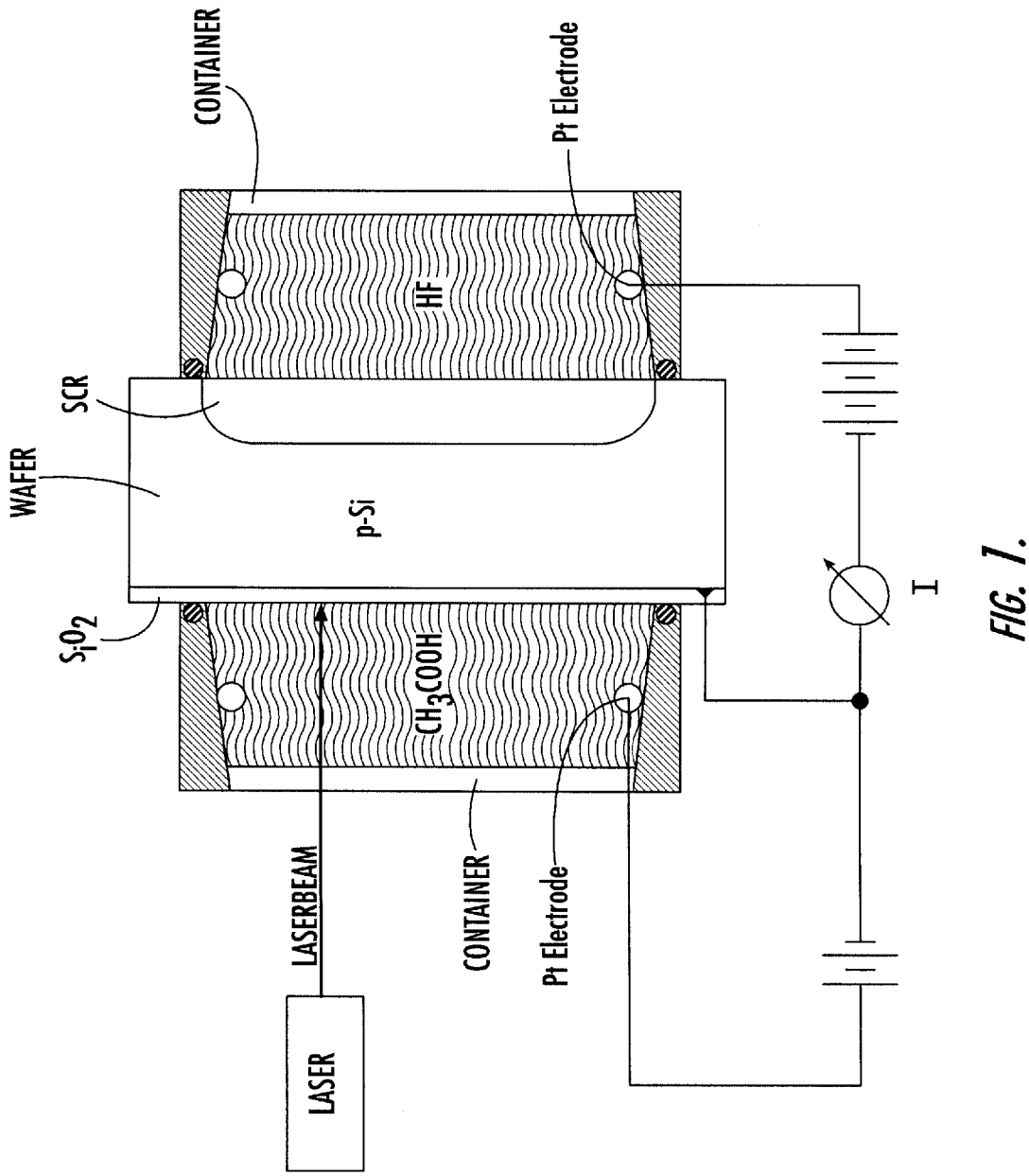

The Schottky contact that collects the photocurrent is formed on the backside of the wafer by biasing the electrolytic HF solution with a platinum electrode in relation to the potential of the wafer. Contact with the wafer is made through one or more resistive contacts. These contacts may be established on the frontside, as shown in the FIGURE, or on the backside of the wafer, preferably around the Schottky contact area.

According to the invention, a gate electrode is on the dielectric layer of $SiO_2$ on the frontside of the wafer. Also present on the frontside of the wafer is an acetic acid solution, biased with a platinum electrode immersed therein, in relation to the potential of the wafer.

The electrolytic solution that forms the gate electrode on the dielectric may be suitably confined by any of the conventionally used arrangements in these types of instruments. The container of the electrolytic solution has a transparent cover or wall. Through the wall or through the thickness of the electrolytic film itself, the laser beam illuminates the wafer covered by the dielectricslayer. This is done to inject excess carriers through the spatial charge region (SCR) of the Schottky junction realized on the backside of the wafer. These carries are eventually collected through the Schottky contact, The inverse biasing voltage of the Schottky contact, established on the backside of the silicon wafer, should be sufficiently high to guarantee that, according to the inverse I-V characteristic of the junction, the latter is in a saturation condition and not excessively high such that the collected current be greater or at least of the same order of magnitude of the junction breakdown current. This is done to provide protection from the effect of series resistances. Typically, for a silicon wafer of p-type conductivity and 10 W/cm resistivity, the bias voltage may be between −5 and −10 volts (inverse bias).

The gate electrode formed by the acetic acid electrolytic solution in contact with the dielectric layer of silicon dioxide on the frontside is biased to shift from a condition of accumulation to an inversion condition. The voltage should not reach values provoking a significant current leakage through the dielectric, compared to the diffusion current collected by the Schottky contact at the backside of the wafer. For relatively thin oxides with a thickness of about 100 angstroms, preliminary tests have demonstrated that gate voltages ranging within about +1.5 V are adequate and produce a negligible current leakage. Of course, thicker oxides would require proportionally increased voltages.

That which is claimed is:

1. A method for characterizing an interface between a semiconductor substrate and a dielectric layer comprising:
   inducing a photocurrent in the semiconductor substrate by scanning the interface with a laser beam;
   measuring the induced photocurrent via a Schottky contact established by inversely biasing, with respect to a potential of a bulk of the semiconductor substrate, a first electrolyte capable of etching any native or thermal oxide on a contact area with the semiconductor substrate, with the measured photocurrent characterizing the interface between the semiconductor substrate and the dielectric layer; and
   controlling a surface potential of the interface via a gate electrode defined on the dielectric layer using a second electrolyte not aggressive to the dielectric layer, and biased with respect to a potential of the bulk of the semiconductor substrate by an electrode immersed therein.

2. A method according to claim 1, wherein the first electrolyte used to form the Schottky contact comprises a diluted HF solution.

3. A method according to claim 1, wherein the second electrolyte comprises an acetic acid solution.

4. A method according to claim 1, wherein the electrode comprises platinum.

5. A method according to claim 1, wherein the step of controlling the surface potential comprises biasing the gate electrode with a voltage in a range of about −1.5 to 1.5 volts via the electrode immersed in the second electrolyte.

6. A method according to claim 1, further comprising biasing the first electrolyte using an electrode immersed therein.

7. A method according to claim 6, wherein the electrode comprises platinum.

8. A method according to claim 6, wherein the first electrolyte is inversely biased via the electrode with a voltage in a range of about −5 to −10 volts.

9. A method for characterizing an interface between a semiconductor substrate and a dielectric layer comprising:
   inducing a photocurrent in the semiconductor substrate;
   measuring the induced photocurrent for characterizing the interface between the semiconductor substrate and the dielectric layer; and
   controlling a surface potential of the interface by biasing a gate electrode defined on the dielectric layer using an electrode immersed in a first electrolyte.

10. A method according to claim 9, wherein the gate electrode is biased with respect to a potential of a bulk of the semiconductor substrate.

11. A method according to claim 9, wherein the electrode comprises platinum.

12. A method according to claim 9, wherein the first electrolyte is inversely biased with a voltage in a range of about −5 to −10 volts.

13. A method according to claim 9, wherein the first electrolyte is not aggressive to the dielectric layer.

14. A method according to claim 9, wherein inducing comprises scanning the interface with a laser beam.

15. A method according to claim 9, wherein the step of controlling the surface potential comprises biasing the gate electrode with a voltage in a range of about −1.5 to 1.5 volts.

16. A method according to claim 9, wherein the step of measuring is performed via a Schottky contact established by inversely biasing with respect to a potential of a bulk of the semiconductor substrate a second electrolyte capable of etching any native or thermal oxide that may exist on a contact area with the semiconductor substrate.

17. A method according to claim 16, wherein the second electrolyte comprises a diluted HF solution.

18. A method according to claim 9, wherein an electrode is immersed in the second electrolyte and comprises platinum.

19. A method according to claim 18, wherein inversely biasing the Schottky contact is performed with a voltage in a range of about −5 to −10 volts applied to the electrode.

20. An instrument for characterizing an interface between a semiconductor substrate and a dielectric layer thereon including a gate electrode on the dielectric layer defined by a first electrolyte not aggressive to the dielectric layer, the instrument comprising:

a laser for inducing a photocurrent in the semiconductor substrate by scanning the interface with a laser beam;

a measurement circuit measuring the induced photocurrent via a Schottky contact established by inversely biasing, with respect to a potential of a bulk of the semiconductor substrate, a second electrolyte capable of etching any native or thermal oxide on a contact area with the semiconductor substrate, the measured photocurrent characterizing the interface between the semiconductor substrate and the dielectric layer; and a biasing circuit controlling a surface potential of the interface via the gate electrode by biasing an electrode immersed in the first electrolyte with respect to the potential of the bulk of the semiconductor substrate.

21. An instrument according to claim 20, wherein said second electrolyte used to form the Schottky contact comprises a diluted HF solution.

22. An instrument according to claim 20, wherein the first electrolyte comprises an acetic acid solution that is not aggressive to the dielectric layer.

23. An instrument according to claim 20, wherein said electrode comprises platinum.

24. An instrument according to claim 20, wherein the gate electrode is biased with a voltage in a range of about −1.5 to 1.5 volts.

25. An instrument according to claim 20, further comprising an electrode immersed in the second electrolyte.

26. An instrument according to claim 25, wherein a voltage within a range of about −5 to −10 volts for inversely biasing the Schottky contact is applied to said electrode.

27. An instrument for characterizing an interface between a semiconductor substrate and a dielectric layer thereon including a gate electrode on the dielectric layer defined by a first electrolyte, the instrument comprising:

a laser for inducing a photocurrent in the semiconductor substrate by scanning the interface with a laser beam;

a measurement circuit measuring the induced photocurrent for characterizing the interface between the semiconductor substrate and the dielectric layer; and a biasing circuit controlling a surface potential of the interface via the gate electrode by biasing an electrode immersed in the first electrolyte with respect to the potential of the bulk of the semiconductor substrate.

28. An instrument according to claim 27, wherein the first electrolyte comprises an acetic acid solution that is not aggressive to the dielectric layer.

29. An instrument according to claim 27, wherein said electrode comprises platinum.

30. An instrument according to claim 27, wherein the gate electrode is biased with a voltage in a range of about −1.5 to 1.5 volts.

31. An instrument according to claim 27, wherein said measurement circuit measures the induced photocurrent via a Schottky contact established by inversely biasing with respect to a potential of a bulk of the semiconductor substrate a second electrolyte capable of etching any native or thermal oxide that may exist on the contact area with the semiconductor substrate.

32. An instrument according to claim 31, wherein said second electrolyte used to form the Schottky contact comprises a diluted HF solution.

33. An instrument according to claim 31, further comprising an electrode immersed in the second electrolyte.

34. An instrument according to claim 33, wherein a voltage within a range of about −5 to −10 volts for inversely biasing the Schottky contact is applied to said electrode.

* * * * *